(12) United States Patent
Huang et al.

(10) Patent No.: US 8,096,461 B2
(45) Date of Patent: Jan. 17, 2012

(54) WIRE-BONDING MACHINE WITH COVER-GAS SUPPLY DEVICE

(75) Inventors: Kai Lin Huang, Kaohsiung (TW); Chia Chin Tu, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 12/629,363

(22) Filed: Dec. 2, 2009

(65) Prior Publication Data

US 2011/0049219 A1 Mar. 3, 2011

Related U.S. Application Data

(60) Provisional application No. 61/275,846, filed on Sep. 3, 2009.

(51) Int. Cl.
*B23K 37/00* (2006.01)
*B23K 20/14* (2006.01)

(52) U.S. Cl. .................. 228/4.5; 228/42; 228/180.5

(58) Field of Classification Search .................. 228/4.5, 228/42, 180.5, 110.1; 219/85.18, 85.1, 56.1, 219/56.21
See application file for complete search history.

(56) References Cited

U.S. PATENT DOCUMENTS

| 4,098,447 | A  | * | 7/1978 | Edson et al. ................... 228/4.5 |
| 4,564,734 | A  | * | 1/1986 | Okikawa .................... 219/56.22 |
| 4,909,427 | A  | * | 3/1990 | Plaisted et al. ................. 228/4.5 |
| 6,234,376 | B1 | * | 5/2001 | Wicen ........................ 228/180.5 |
| 6,547,540 | B1 | * | 4/2003 | Horng et al. ............. 417/423.14 |
| 6,729,528 | B2 | * | 5/2004 | Seki et al. .......................... 228/8 |
| 2008/0099531 | A1 | * | 5/2008 | Wong et al. .................... 228/4.5 |

* cited by examiner

*Primary Examiner* — Scott Kastler
*Assistant Examiner* — Michael Aboagye
(74) *Attorney, Agent, or Firm* — Cooley LLP

(57) ABSTRACT

A wire-bonding machine includes a main body, a fixture block, a mounting block, a gas supply tube, a cover-gas supply device, a capillary tool and an electrode. The fixture block is provided with a chamber defined therein and a central bore formed at one side wall of the fixture block communicating the chamber. The mounting block has a fixture member extending upwards for being mounted to the main body and an electrode clamping member extending downwards into the chamber of the fixture block. The cover-gas supply device has a continuous gas passage and an orifice defined therein. The protection gas flows in a steady flow field around the orifice in the continuous gas passage of the cover-gas supply device so as to result in better ball formation during the ball formation and ball-bonding process.

18 Claims, 7 Drawing Sheets

WIRE-BONDING MACHINE WITH COVER-GAS SUPPLY DEVICE

CROSS REFERENCE TO RELATED APPLICATION

This application claims the priority benefit of U.S. Provisional Application Ser. No. 61/275,846, filed on Sep. 3, 2009. The full disclosures of the above-identified application are incorporated herein by reference.

TECHNICAL FIELD

The disclosure is related to a new apparatus for forming a ball at the end of bonding wire or lead wire extending from a capillary bonding tool, and more particularly to a new apparatus providing a protection gas with the desired flow field for forming a ball at the end of bonding wire in the wire bonding process.

BACKGROUND

Electrically connecting of lead or bonding wires to a semiconductor chip or die mounted on a lead frame or substrate for coupling to external circuitry is generally accomplished by "ball/wedge" bonding. According to this technique, a lead wire or bonding wire 11 is held in a capillary tool 12 so that the wire 11 projects beyond the end of the capillary tool 12 as shown in FIG. 1. The capillary tool 12 forms part of a ball bonding machine in which the tool is appropriately mounted and positioned over the metallized die pad 15 of an integrated circuit chip or other substrate. As shown in FIG. 1, a ball 17 of metal is formed at the end of the wire 11 by melting for example with an electrode 13. This procedure is sometimes referred to as "flame-off".

After solidification, the metal ball 17 at the end of the wire is brought into intimate contact with the metallized die pad 15 as shown in FIG. 2. A bond is formed typically by thermocompression bonding applying a specified force and temperature for a specified period of time. Metallic welding and diffusion combine to form this basic bond. Alternatively, ultrasonic bonding or other form of energy may be used. The capillary tool 12 and substrate are then moved relative to each other for bonding of the wire at another location such as for example a finger at the lead frame or on the substrate. At this location, a wedge bond between the lead wire 11 and the finger is generally formed and the wire 11 is severed below the bonding tool. In this manner a lead wire connection is established between the metallized die pad of a chip and the lead frame or the substrate for coupling to external circuitry.

Ball bonding is the preferred method for welding lead or bonding wires to the die pad of integrated circuit chips because the ball can tolerate a greater range of bonding parameters without weakening the wire and furthermore, the lead or bonding wires can be led in any direction from the symmetrical weld. A number of problems are encountered in ball formation however which have generally limited its application to the use of relatively expensive gold lead wires and bonding wires. The primary difficulty in applying the ball bonding method to, for example copper wire and aluminum wire occurs during ball formation. The tip of the wire is melted either by a hydrogen gas torch or by arc discharge between the tip of the wire and a suitably placed electrode. However, during ball melting and formation, the copper or other reactive metal wire oxidizes and the resulting oxide film prevents or interferes in the subsequent ball weld to the die pad. Oxidation also prevents uniform quality ball formation. As a result, the ball bonding technique has generally been limited to the use of gold wires.

The wire used in such ball-bonding processes may be a non-reactive metal such as gold, or a more reactive metal such as copper, silver, palladium or aluminum. When reactive metals such as copper or aluminum are melted in air, they may react with oxygen to form oxides which interfere with bonding. It is therefore desirable to provide a protective cover gas which does not react with the metal around the molten ball, at least until the surface has solidified and cooled sufficiently to become non-reactive. Therefore, methods and apparatus have been developed for providing such a cover gas in which a moveable shroud or shield moves into position before ball formation. The shroud is then filled with a cover gas and the ball is formed at the end of a capillary tool. The shroud is then removed, and the ball-bonding process is completed. For example, U.S. Pat. No. 6,234,376, as shown in FIG. 3, discloses an apparatus for supplying a cover gas to a ball-bonding assembly to protect the molten ball from the effects of exposure to air. The apparatus comprises a gas-containment tube 20 for receiving a shielding gas, the tube 20 having transverse in-line orifices 22, 24 through which the capillary head 16 of the ball-bonding machine can pass. The electrode 30 of an electric flame-off (EFO) device is positioned in the tube 20 such that when the capillary head 16 is in a first position and upon energizing of the EFO, an arc discharge can be formed between the electrode head 32 and the end of a bonding wire which is fed through the capillary head, thereby forming a molten ball 17 at the end of the wire 11.

However, such apparatuses require complex movement of the shroud relative to the capillary tool, requiring control equipment and adding steps to the bonding process. Furthermore, the rapid removal of the shroud after ball formation causes a sudden rush of air to impinge on the hot wire ball. The air can cause surface oxidation of reactive metals, as well as uneven cooling of both reactive and non-reactive metals. Furthermore, the open-ended shroud or tube requires a relatively large amount of gas to maintain the cover gas during the ball formation at the capillary tool and fails to provide a desired flow field of the cover gas around ball and the capillary tool during the ball-bonding process.

SUMMARY

In some embodiments, a wire-bonding machine includes a main body, a fixture block, a mounting block, a gas supply tube, a cover-gas supply device, a capillary tool and an electrode. The fixture block is provided with a chamber defined therein and a central bore formed at one side wall of the fixture block communicating the chamber. The mounting block has a fixture member extending upwards for being mounted to the main body and an electrode clamping member extending downwards into the chamber of the fixture block. The gas supply tube is connected to the chamber of the fixture block for supplying a protection gas, and the cover-gas supply device has a continuous gas passage and an orifice defined therein, wherein the cover-gas supply device is mounted to the fixture block through the central hole with the continuous gas passage communicating with the chamber. The capillary tool is mounted to the main body for up and down reciprocating movement within the orifice of the cover-gas supply device with respect to die pads on a chip to be bonded. The electrode has one end thereof clamped by the electrode clamping member and the other end extending within continuous gas passage to the orifice. The protection gas flows in a steady flow field around the orifice in the continuous gas passage of the cover-gas supply device. It should be noted that the steady flow field of the protection gas around the ball at the area of the orifice results in better ball formation during the ball formation and ball-bonding process.

In other embodiments, the cover-gas supply device is provided with a straight channel extending to the orifice and a circular channel surrounding the orifice. According to these embodiments, the circular channel is provided with a plurality of radial guarding blades surrounding the orifice and thus a faster flow field of the protection gas forms around the area of the orifice. It should be noted that the faster flow field of the protection gas forms around the ball at the area of the orifice results in better ball bonding during the ball formation and ball-bonding process.

In further embodiments, a split with an electrode holding portion is formed in the electrode clamping member of the mounting block. The mounting block is plated with a high conductive material, such as a gold coating or film, on the entire outer surfaces thereof. After one end of the electrode is inserted the electrode holding portion through the central bore, a retaining screw is screwed into the retaining hole in the electrode clamping member so as to securely clamping the electrode within the electrode clamping member. According to these embodiments, the entire outer surfaces of the mounting block are coated with a conductive material to enhance the conductivity of the mounting block, thereby increasing the electronic flame off (EFO) performance of the electrode.

In yet further embodiments, the fixture block is provided with a plurality of mounting holes surrounding the chamber and the mounting block is also provided with a plurality of holes corresponding to the mounting holes at the fixture block and the mounting block is mounted to the fixture block by fastening the screws or bolts through the holes into the mounting holes. According to these embodiments, the position of the electrode can be adjusted to its desired position after it is assembled to the fixture block such that it can be accurately positioned within the cover-gas supply device with respect to the capillary tool.

BRIEF DESCRIPTION OF THE DRAWINGS

Exemplary embodiments will be discussed herein with reference to the accompanying drawings, wherein elements having the same reference numeral designations represent like elements throughout and wherein.

DETAILED DESCRIPTION

Figure 1:
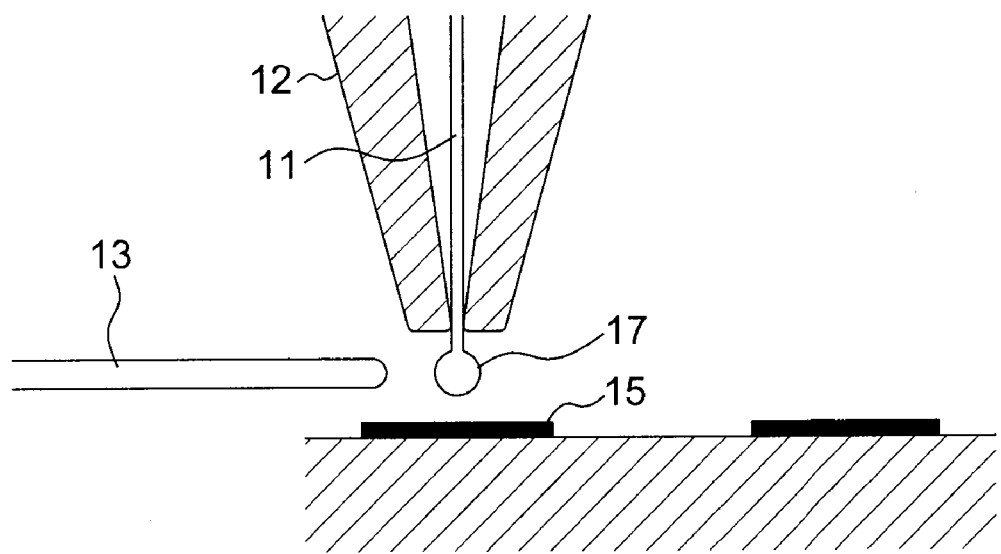
FIGS. 1-2 are diagrammatic side cross sections of a ball bonding process as known in the prior art.
Figure 2:
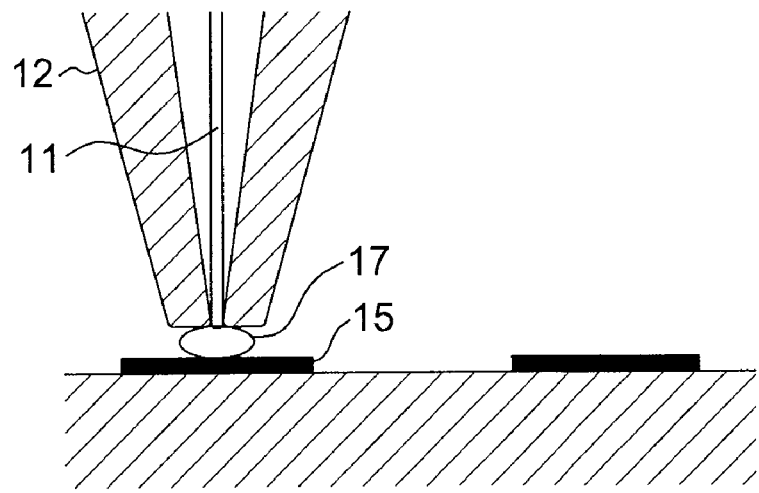

In the following detailed description, for purposes of explanation, numerous specific details are set forth in order to provide a thorough understanding of the present invention. It will be apparent, however, that the present invention may be practiced without these specific details. In other instances, well-known structures and devices are schematically shown in order to simplify the drawing.

Figure 3:
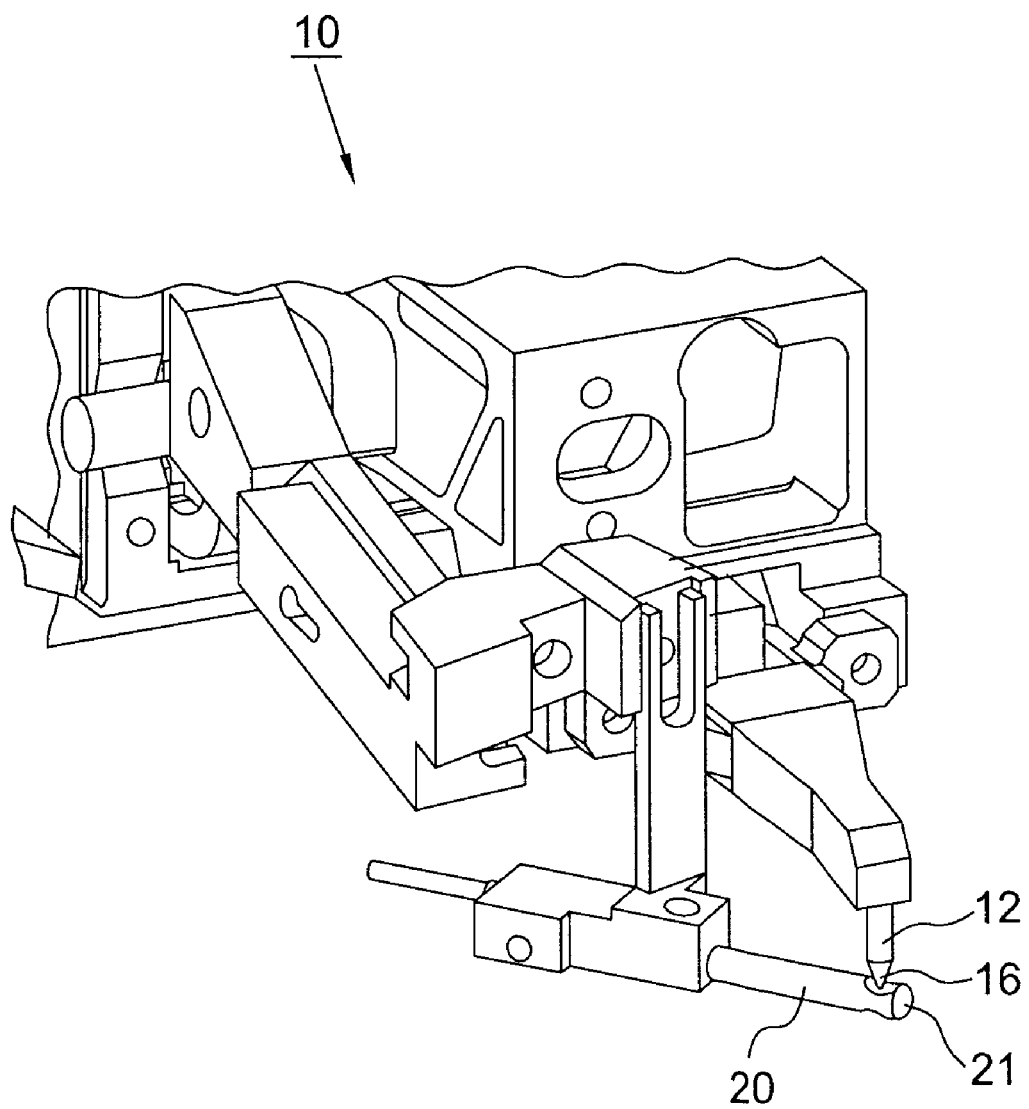
FIG. 3 is a perspective view of a wire-bonding machine as shown in U.S. Pat. No. 6,234,376.
Figure 4:
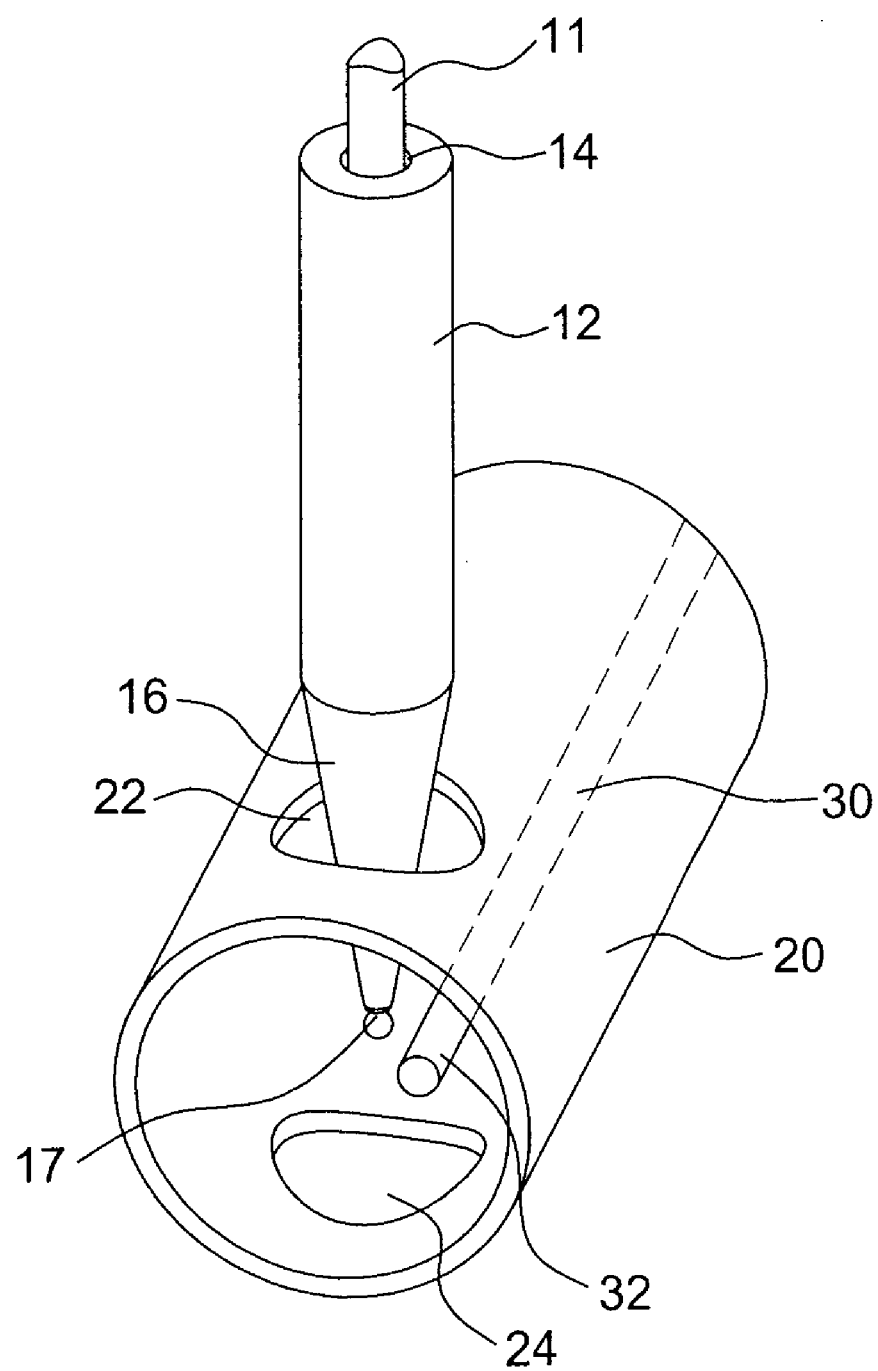
FIG. 4 is a perspective view of the capillary tool and gas tube of the wire-bonding machine as shown in U.S. Pat. No. 6,234,376.
Figure 5:
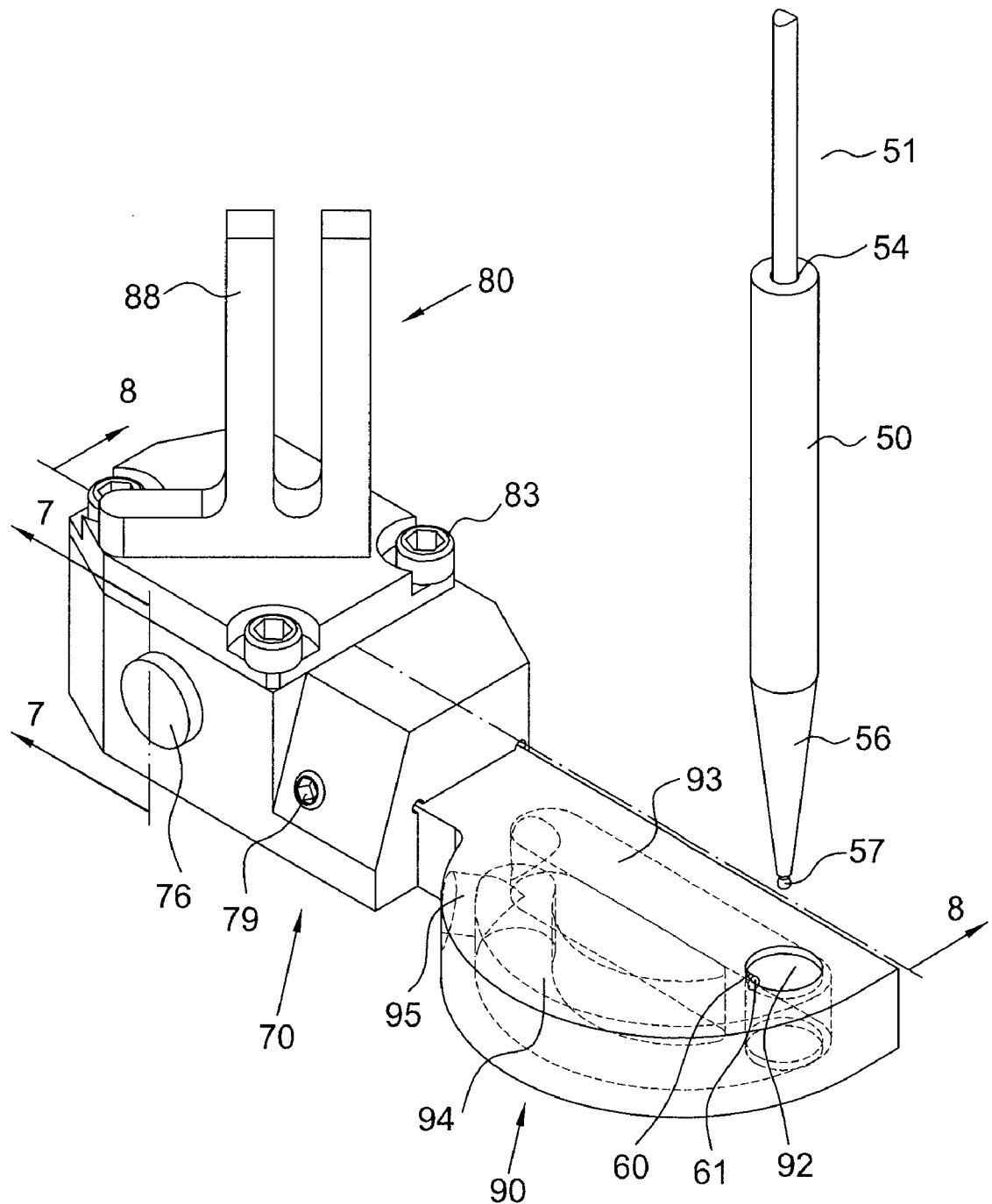
FIG. 5 is a perspective view of the head assembly of a wire-bonding machine with a cover-gas supply device in accordance with one embodiment of the present invention.

Referring to FIGS. 3 and 5, a method and apparatus for fowling bumps on a semiconductor die using aluminum or copper bonding wire are shown. It is performed using a conventional modified thermo-sonic wire bonding machine having a capillary tool and an electronic flame off (EFO). Suitable wire bonding machines, as shown in FIG. 3, are manufactured by Kulicke and Soffa, Industries Inc., Horsham, Pa. and others. These wire bonding machines are modified by utilizing the head assembly of the wire-bonding machine with the cover-gas supply devices in accordance with embodiments of the present invention.

Figure 6:
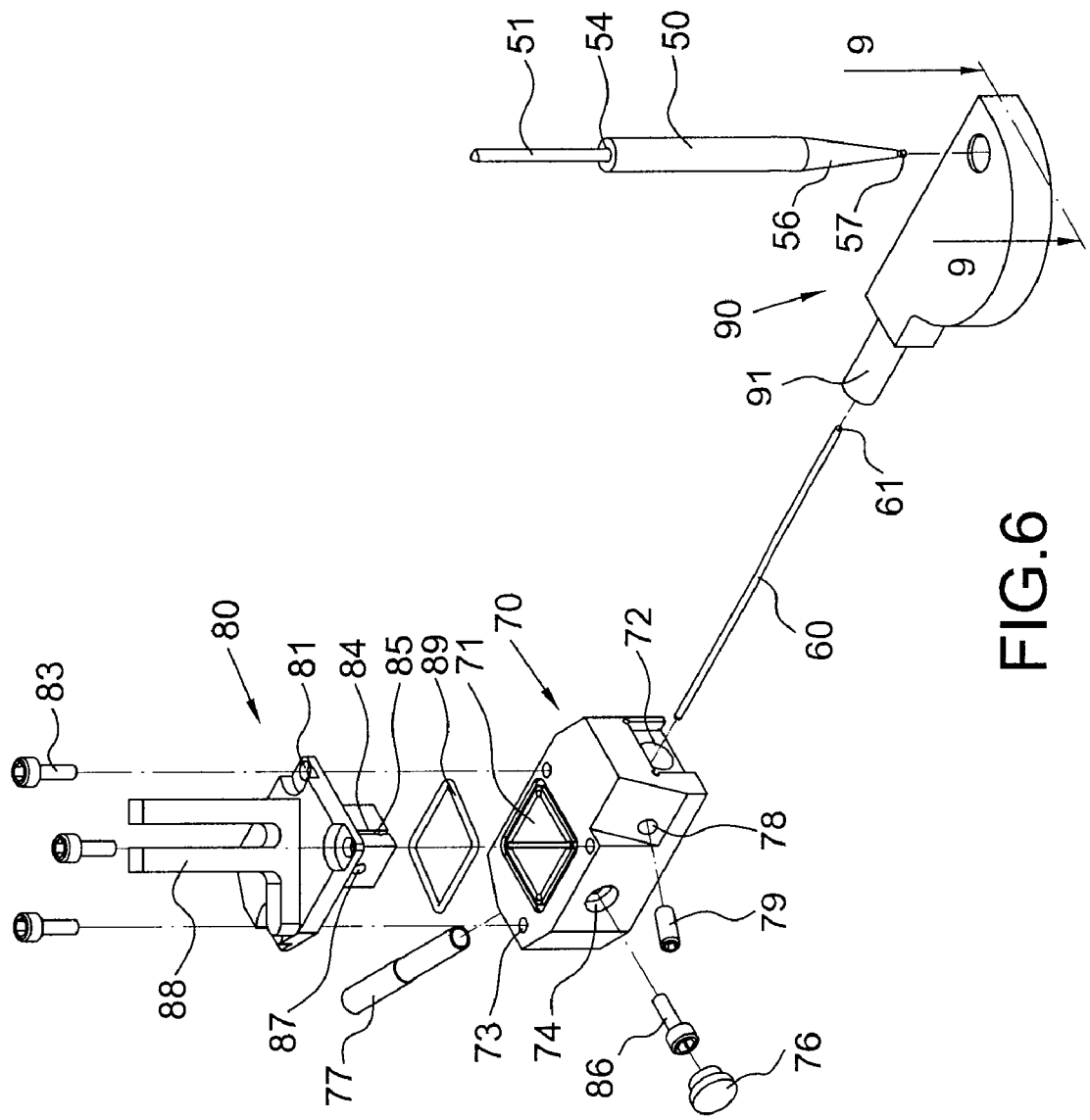
FIG. 6 is an exploded view of the head assembly of the wire-bonding machine of FIG. 5.

Referring to FIGS. 5 and 6, they illustrate the head assembly of a wire-bonding machine with a cover-gas supply device in accordance with one embodiment of the present invention. According to this embodiment, the head assembly of a wire-bonding machine mainly includes a capillary tool 50, an electronic flame off (EFO) electrode 60, a fixture block 70, a mounting block 80, and a cover-gas supply device 90. The capillary tool 50 is mounted to the main body of the wire-bonding machine 10 for up and down reciprocating movement with respect to the die pads on the chip to be bonded. Initially, a metal wire 51 of copper or aluminum is retained within a central bore 54 through the capillary tool 50 of the wire-bonding machine 10. Next a molten ball 57 is formed on the end of the wire 51 by using an electronic flame off (EFO) electrode 60 extending through the cover-gas supply device 90. During the electronic flame off, the wire 51 and an electrode 60 are electrically coupled to a voltage source. The electrode 60 is preferably formed of tungsten. A voltage of from about 1,000 volts to 6,000 volts is applied in pulses such that a spark discharge crosses the gap between the end of the wire 51 and the tip 61 of the electrode 60 and heats the wire 51 to form the ball 57 at its end. The gap between the electrode tip 61 and the end of the wire 51 during the electronic flame off is about 0.005 inches.

During the ball forming step, a protection gas comprising an inert gas, such as nitrogen or argon, and hydrogen, is provided within the cover-gas supply device 90 to prevent oxidation hardening of the ball 57. The percentage hydrogen to the inert gas by volume can be from about 0-10% (i.e., vol % hydrogen-vol % inert gas). Then, the capillary tool 50 shapes the molten ball 57 into a ball bump and bonds the ball bump to a die pad foamed on a semiconductor die (not shown). The capillary tool 50 can be formed with a flared opening 56 to facilitate shaping of the ball bump. For shaping the ball bump, the molten ball 57 can be pulled into the opening 56 by pulling the wire 51 or the capillary tool 50 can simply press the molten ball 57 against the die pad. During the bonding step, the die is supported by a heated substrate. In addition, during the bonding step, the capillary tool 50 applies a vertical load on the ball 57 and the die pad while ultrasonically exciting the wire 51. A vibrational frequency for the capillary tool 50 can be between about 30 kHz to 160 kHz with a representative frequency about 60 kHz. A vertical load applied by the capillary tool 50 can be between about 50 grams to 300 grams with a representative load about 130 grams. During the bonding step, the die and the substrate can be heated to a temperature of between about 80° C. to 150° C.

Figure 7:
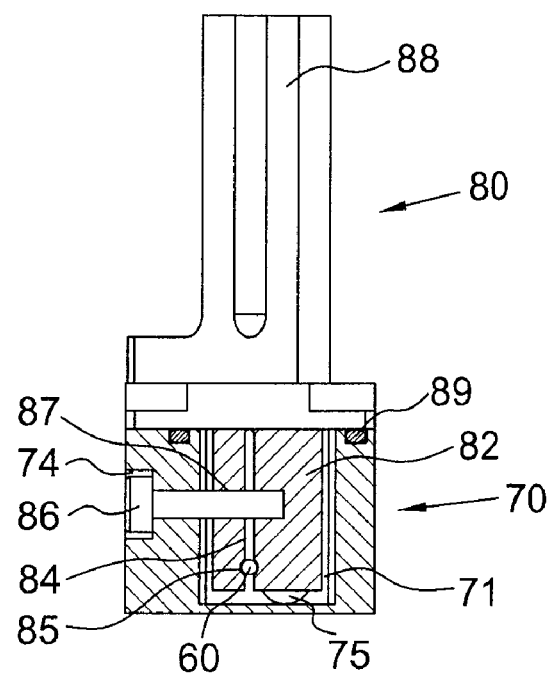
FIG. 7 is a cross-sectional view along line 7-7 of the head assembly of the wire-bonding machine of FIG. 5.
Figure 8:
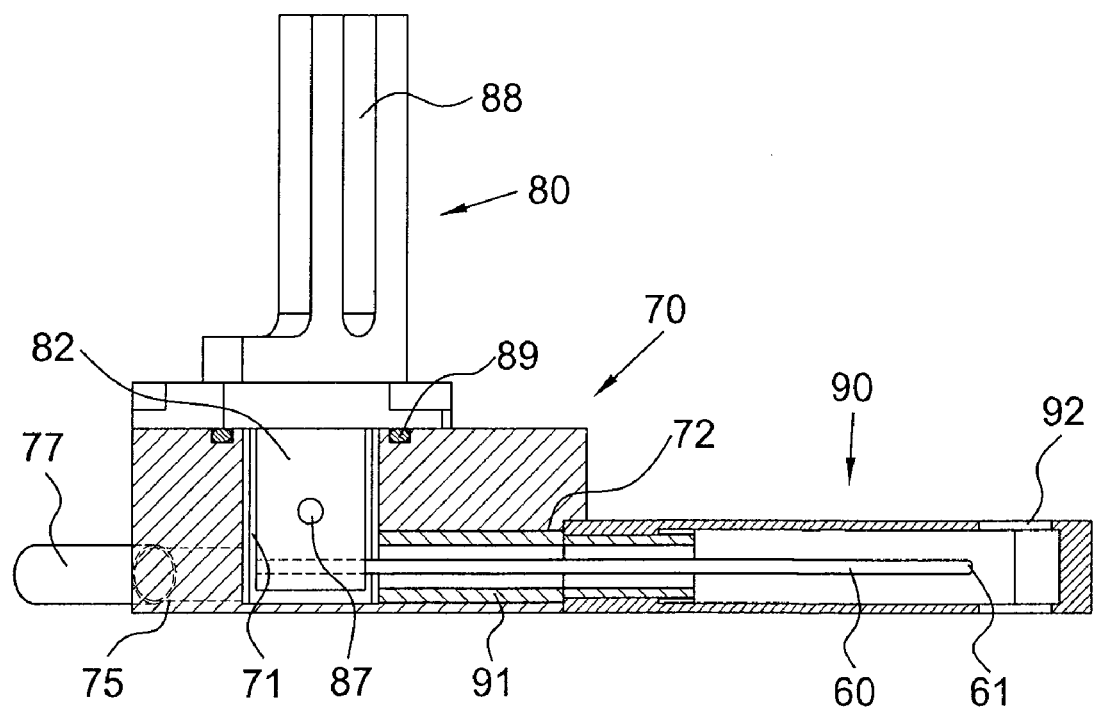
FIG. 8 is a cross-sectional view along line 8-8 of the head assembly of the wire-bonding machine of FIG. 5.

Referring to FIGS. 6-8, the fixture block 70 is provided with a chamber 71 and a central bore 72 at one side wall of the fixture block 70 communicating the chamber 71 therein, wherein the electrode 60 and the cover-gas supply device 90 are retained through the central bore 72 to the fixture block 70, and the mounting block 80 is mounted to the fixture block 70 with its electrode clamping member 82 extending into the central portion of the chamber 71. The fixture block 70 is provided with a plurality of mounting holes 73 surrounding the chamber 71 and the mounting block 80 is also provided with a plurality of holes 81 corresponding to the mounting holes 73 at the fixture block 70 such that the mounting block 80 is mounted to the fixture block 70 by fastening the screws or bolts 83 through the holes 81 into the mounting holes 73, A sealing ring 89 is provided surrounding the chamber 71 and between the fixture block 70 and the mounting block 80. Referring to FIGS. 6 and 7, a split 84 with an electrode holding portion 85 is formed in the electrode clamping member 82 of the mounting block 80. After one end of the electrode 60 is inserted the electrode holding portion 85 through the central bore 72, a retaining screw 86 is screwed into the retaining hole 87 in the electrode clamping member 82 through the opening hole 74 so as to securely clamping the electrode 60 within the electrode clamping member 82. A cap 76 is inserted into the opening hole 74 for sealing the opening hole 74. A gas supply tube 77 is inserted into gas hole 75 of the fixture block 70 to supply the required protection gas through the chamber 71 to the cover-gas supply device 90. A U-shape fixture member 88 extends upwards from the mounting block 80 for being mounted to the wire bonding machine 10. According to the present invention, the entire outer surfaces of the mounting block 80 are coated with a conductive material such as gold film so as to enhance the conductivity of the mounting block 80, thereby increasing the electronic flame off (EFO) performance of the electrode 60. For the conventional wire bonding machine 10, the mounting block is made of stainless material and the electrode 60 is electrically coupled to a voltage source only through a conductive screw within the mounting block and the fixture block. Therefore, the electronic flame off (EFO) performance of the electrode 30 needs to be enhanced. Furthermore, since the electrode 30 is fixed within the fixture block, the electrode 30 cannot be adjusted its position if the electrode 30 is not disposed at the desired position, Compared with the conventional wire bonding machine 10, the present invention has the advantages of better electronic flame off (EFO) performance for the electrode 60 and the position of the electrode 60 can be adjusted to its desired position after it is assembled to the fixture block 70 such that it can be accurately positioned with respect to the capillary tool 50.

Figure 9:
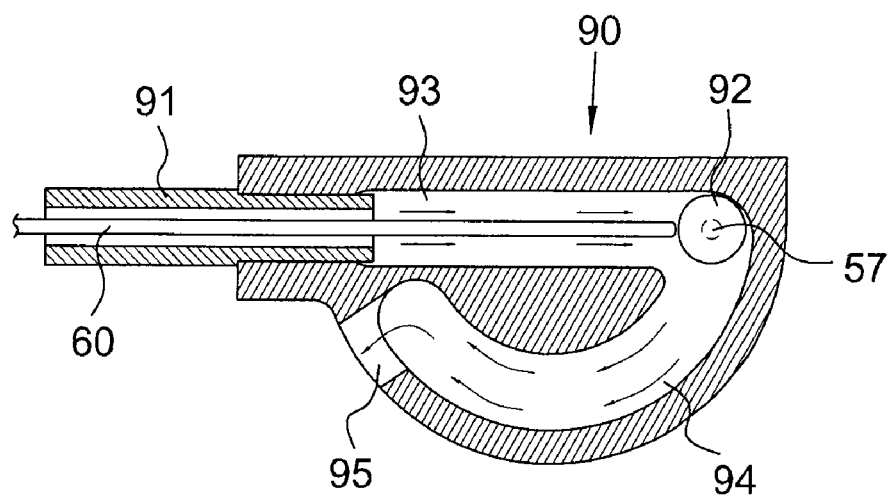
FIG. 9 is a cross-sectional view along line 9-9 of the cover-gas supply device of the wire-bonding machine of FIG. 5.

Now referring to FIGS. 6, 8 and 9, they show that the cover-gas supply device 90 is assembled to the fixture block 70. For assembly, the extending tube 91 is disposed into the central hole 72 and then a mounting screw 79 is screwed into the retaining hole 78 to abut against the extending tube 91 so as to securely retain the extending tube 91 within the fixture block 70. The electrode 60 extends from the electrode clamping member 82 of the mounting block 80 through the central hole 72 and the extending tube 91 to the orifice 92 of the cover-gas supply device 90. As shown in FIG. 9, the cover-gas supply device 90 is provided with a straight channel 93 extending from the extending tube 91 to the orifice 92 and a curve channel 94 between the orifice 94 and the outlet 95 such that the required protection gas flows from the chamber 71 through the straight channel 93, the orifice 92, and the curve channel 94 to the outlet 95. According to this embodiment, the straight channel 93 and the curve channel 94 form a continuous gas passage such that the gas flow (shown as arrows) of the protection gas maintains as a steady flow field at the area of the orifice 92. It should be noted that the steady flow field of the protection gas around the ball 57 at the area of the orifice 92 results in better ball formation during the ball formation and ball-bonding process. In additions, the protection gas can be recycled from the outlet 95 to the protection gas supply source so as to reduce the consumed amount of protection gas.

Figure 10:
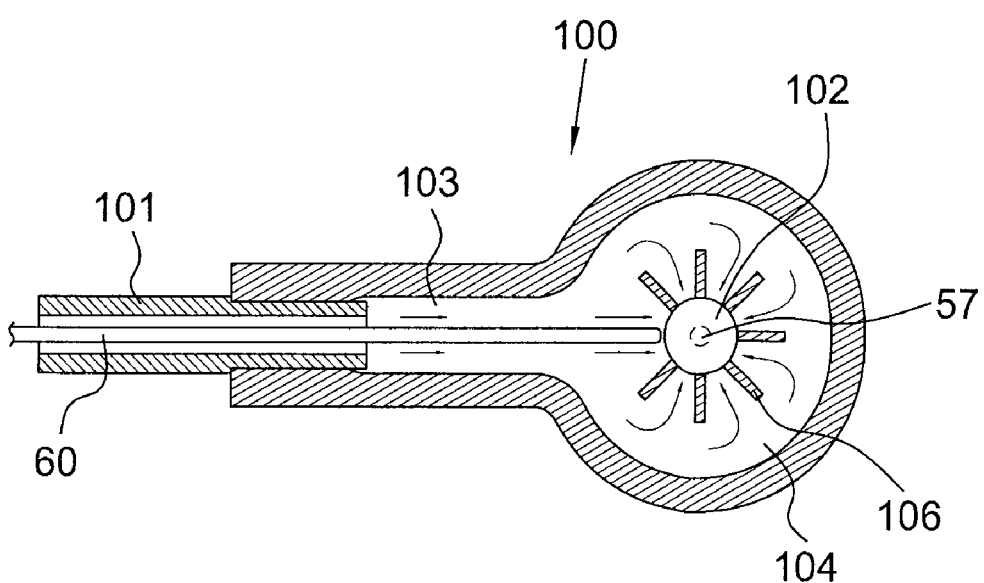
FIG. 10 is a cross-sectional view showing a cover-gas supply device in accordance with another embodiment of the present invention.

Referring to FIG. 10, it illustrates another embodiment of the cover-gas supply device 100. Like the cover-gas supply device 90, the extending tube 101 is retained within the fixture block 70 and the electrode 60 extends from the electrode clamping member 82 of the mounting block 80 through the central hole 72 and the extending tube 101 to the orifice 102 of the cover-gas supply device 100. As shown in FIG. 10, the cover-gas supply device 100 is provided with a straight channel 103 extending from the extending tube 101 to the orifice 102 and a circular channel 104 surrounding the orifice 102. According to this embodiment, the circular channel 104 is provided with a plurality of radial guarding blades 106 surrounding the orifice 102 and thus an eddy flow field of the protection gas forms around the ball 57 at the area of the orifice 102. It should be noted that the eddy flow field produces a faster flow of the protection gas around the ball 57 at the area of the orifice 102, thereby resulting in better ball bonding during the ball formation and ball-bonding process.

Although several embodiments have been disclosed in detail, it is to be understood that many other possible modifications and variations can be made by those skilled in the art without departing from the spirit and scope of the present disclosure. Such alterations, modifications and improvements as are made obvious by this disclosure are intended to be part of this description though not expressly stated herein, and are intended to be within the spirit and scope of the invention. The foregoing description is by way of example only, and not limiting. The invention is limited only as defined in the following claims and equivalents thereto.

What is claimed is:
1. A wire-bonding machine, comprising:
a main body;
a fixture block provided with a chamber defined therein and a central bore formed at one side wall of the fixture block communicating with the chamber;
a mounting block having a fixture member extending upwards for being mounted to the main body and an electrode clamping member extending downwards into the chamber of the fixture block;
a gas supply tube connected to the chamber of the fixture block for supplying a protection gas;
a cover-gas supply device having a continuous gas passage and an orifice defined therein, wherein the cover-gas supply device is mounted to the fixture block through the central bore with the continuous gas passage communicating with the chamber;
a capillary tool mounted to the main body for up and down reciprocating movement within the orifice of the cover-gas supply device with respect to die pads on a chip to he bonded; and
an electrode with one end thereof clamped by the electrode clamping member and the other end extending within the continuous gas passage to the orifice;
wherein the protection gas flows in a steady flow field around the orifice in the continuous gas passage of the cover-gas supply device.
2. The wire-bonding machine as claimed in claim 1, wherein the electrode clamping member of the mounting block forms a split with an electrode holding portion for clamping the electrode, and the mounting block is plated with a high conductive material on the entire outer surfaces thereof, thereby increasing the electronic flame off (EFO) performance of the electrode.

3. The wire-bonding machine as claimed in claim 1, wherein the fixture block includes a plurality of mounting holes surrounding the chamber and the mounting block also includes a plurality of holes corresponding to the mounting holes at the fixture block, a plurality of fasteners mount the mounting block to the fixture block through the holes of the mounting block into the mounting holes at the fixture block in such a manner that the position of the electrode can be adjusted to its desired position after it is assembled to the fixture block for being accurately positioned within the cover-gas supply device with respect to the capillary tool.

4. The wire-bonding machine as claimed in claim 1, wherein the continuous gas passage within the cover-gas supply device includes a straight channel extending from the chamber to the orifice and a curve channel between the orifice and an outlet.

5. A wire-bonding machine, comprising:
a main body;
a fixture block provided with a chamber defined therein and a central bore formed at one side wall of the fixture block communicating with the chamber;
a mounting block having a fixture member extending upwards for being mounted to the main body and an electrode clamping member extending downwards into the chamber of the fixture block;
a gas supply tube connected to the chamber of the fixture block for supplying a protection gas;
a cover-gas supply device having a gas passage and an orifice defined therein, wherein the cover-gas supply device is mounted to the fixture block through the central bore with the gas passage communicating with the chamber;
a capillary tool mounted to the main body for up and down reciprocating movement within the orifice of the cover-gas supply device with respect to die pads on a chip to be bonded; and
an electrode with one end thereof clamped by the electrode clamping member and the other end extending within the gas passage to the orifice;
wherein the mounting block is plated with a high conductive material on the entire outer surfaces thereof, thereby increasing the electronic flame off (EFO) performance of the electrode.

6. The wire-bonding machine as claimed in claim 5, wherein the electrode clamping member of the mounting block forms a split with an electrode holding portion for clamping the electrode.

7. The wire-bonding machine as claimed in claim 5, wherein the fixture block includes a plurality of mounting holes surrounding the chamber and the mounting block also includes a plurality of holes corresponding to the mounting holes at the fixture block, a plurality of fasteners mount the mounting block to the fixture block through the holes of the mounting block into the mounting holes at the fixture block in such a manner that the position of the electrode can be adjusted to its desired position after it is assembled to the fixture block for being accurately positioned within the cover-gas supply device with respect to the capillary tool.

8. The wire-bonding machine as claimed in claim 5, wherein the gas passage within the cover-gas supply device includes a straight channel extending from the chamber to the orifice and a curve channel between the orifice and an outlet to form a continuous gas passage such that the protection gas flows in a steady flow field around the orifice in the continuous gas passage of the cover-gas supply device.

9. The wire-bonding machine as claimed in claim 5, wherein the gas passage within the cover-gas supply device includes a straight channel extending from the chamber to the orifice and a circular channel surrounding the orifice such that the protection gas flows in an eddy field around the orifice in the gas passage of the cover-gas supply device.

10. The wire-bonding machine as claimed in claim 9, wherein the circular channel has a plurality of radial guarding blades disposed surrounding the orifice.

11. A wire-bonding machine, comprising:
a main body;
a fixture block provided with a chamber defined therein and a central bore formed at one side wall of the fixture block communicating with the chamber, wherein the fixture block includes a plurality of mounting holes surrounding the chamber;
a mounting block having a fixture member extending upwards for being mounted to the main body and an electrode clamping member extending downwards into the chamber of the fixture block, wherein the mounting block includes a plurality of holes corresponding to the mounting holes at the fixture block;
a plurality of fasteners mounting the mounting block to the fixture block through the holes of the mounting block into the mounting holes at the fixture block;
a gas supply tube connected to the chamber of the fixture block for supplying a protection gas;
a cover-gas supply device having a gas passage and an orifice defined therein, wherein the cover-gas supply device is mounted to the fixture block through the central bore with the gas passage communicating with the chamber;
a capillary tool mounted to the main body for up and down reciprocating movement within the orifice of the cover-gas supply device with respect to die pads on a chip to be bonded; and
an electrode with one end thereof clamped by the electrode clamping member and the other end extending within the gas passage to the orifice;
whereby the position of the electrode can be adjusted to its desired position after the electrode is assembled to the fixture block for being accurately positioned within the cover-gas supply device with respect to the capillary tool.

12. The wire-bonding machine as claimed in claim 11, wherein the electrode clamping member of the mounting block forms a split with an electrode holding portion for clamping the electrode.

13. The wire-bonding machine as claimed in claim 11, wherein the mounting block is plated with a high conductive material on the entire outer surfaces thereof, thereby' increasing the electronic flame off (EFO) performance of the electrode.

14. The wire-bonding machine as claimed in claim 11, wherein the gas passage within the cover-gas supply device includes a straight channel extending from the chamber to the orifice and a curve channel between the orifice and an outlet to form a continuous gas passage such that the protection gas flows in a steady flow field around the orifice in the continuous gas passage of the cover-gas supply device.

15. The wire-bonding machine as claimed in claim 11, wherein the gas passage within the cover-gas supply device includes a straight channel extending from the chamber to the orifice and a circular channel surrounding the orifice such that the protection gas flows in an eddy flow field around the orifice in the gas passage of the cover-gas supply device.

16. The wire-bonding machine as claimed in claim 15, wherein the circular channel has a plurality of radial guarding blades disposed surrounding the orifice.

17. A wire-bonding machine, comprising:

a cover-gas supply device including an inlet and an orifice, the cover-gas supply device defining a substantially circular channel circumscribing the orifice and in communication with the inlet, the inlet configured to receive a protection gas;

a capillary tool configured for reciprocating movement within the orifice; and an electrode adjacent to the orifice;

wherein the protection gas flows in an eddy flow field adjacent to the orifice of the cover-gas supply device; and wherein a plurality of radial airflow channels connect the substantially circular channel and the orifice and the eddy flow field is formed at least partially by the protection gas flowing from the substantially circular channel into the orifice through the plurality of radial airflow channels.

18. The wire-bonding machine as claimed in claim 17, wherein the cover-gas supply device further includes a plurality of radial blades adjacent to the orifice, each adjacent pair of the plurality of radial blades defining a corresponding one of the plurality of radial airflow channels.

* * * * *